United States Patent
Park et al.

(10) Patent No.: US 6,852,623 B2
(45) Date of Patent: Feb. 8, 2005

(54) METHOD FOR MANUFACTURING ZINC OXIDE SEMICONDUCTORS

(75) Inventors: Seong-Ju Park, Kwangju (KR); Kyoung-Kook Kim, Kwangju (KR)

(73) Assignee: Kwangju Institute of Science and Technology, Kwangju (KR)

( * ) Notice: Subject to any disclaimer, the term of this patent is extended or adjusted under 35 U.S.C. 154(b) by 0 days.

(21) Appl. No.: 10/701,483

(22) Filed: Nov. 6, 2003

(65) Prior Publication Data

US 2004/0175860 A1 Sep. 9, 2004

(30) Foreign Application Priority Data

Mar. 7, 2003 (KR) ................................ 10-2003-0014397

(51) Int. Cl.$^7$ .............................................. H01L 21/44
(52) U.S. Cl. ...................... 438/663; 438/104; 438/510; 438/514; 438/517; 438/542
(58) Field of Search ................................ 438/104, 510, 438/514, 517, 518, 542, 663

(56) References Cited

U.S. PATENT DOCUMENTS

| | | | |
|---|---|---|---|
| 5,106,770 A * | 4/1992 | Bulat et al. ................... | 438/193 |
| 5,508,209 A * | 4/1996 | Zhang et al. ................. | 438/162 |
| 6,010,931 A * | 1/2000 | Sun et al. ..................... | 438/240 |
| 6,169,357 B1 * | 1/2001 | Potter .......................... | 313/495 |
| 6,448,612 B1 * | 9/2002 | Miyazaki et al. ............ | 257/344 |
| 6,608,353 B2 * | 8/2003 | Miyazaki et al. ............ | 257/350 |
| 6,689,671 B1 * | 2/2004 | Yu et al. ....................... | 438/486 |
| 6,743,649 B2 * | 6/2004 | Yamazaki et al. ............ | 438/29 |
| 2003/0180996 A1 * | 9/2003 | Yamazaki et al. ........... | 438/200 |
| 2004/0065883 A1 * | 4/2004 | Yamazaki et al. ............ | 257/59 |

OTHER PUBLICATIONS

"Tetsuya Yamamoto et al.; Solution Using a Codoping Method to Unipolarity for the Fabrication of p–Type ZnO"; Jpn. J. Appl. Phys.; vol. 38, Part 2, No. 2B; Feb. 15, 1999; pp L166–L169.

Mathew Joseph et al.; "p–Type Electrical Conduction in ZnO Thin Films by Ga and N Codoping"; Jpn. J. Appl. Phys.; vol. 38, Part 2, No. 11A; Nov. 1, 1999; pp L1205–L1207.

Toru Aoki et al.; "ZnO diode fabricated by excimer–laser doping"; Applied Physics Letters; vol. 76, No. 22; May 29, 2000; pp 3257–3258.

Y. R. Ryu et al.; "Synthesis of p–type ZnO films"; Journal of Crystal Growth; 2000; pp 330–334.

D.C. Look et al.; "Characterization of homoepitaxial p–type ZnO grown by molecular beam epitaxy"; Applied Physics Letters; vol 81, No. 10; Sep. 2, 2002; pp 1830–1832.

* cited by examiner

*Primary Examiner*—Amir Zarabian
*Assistant Examiner*—Thanh Y. Tran
(74) *Attorney, Agent, or Firm*—Oliff & Berridge, PLC

(57) ABSTRACT

Disclosed herein is a method for manufacturing a zinc oxide semiconductor. The method comprises the steps of forming a zinc oxide thin film including a group V element as a dopant on a substrate by using a zinc oxide compound containing a group V element or an oxide thereof, charging the substrate having the zinc oxide thin film formed thereon into a chamber for thermal annealing, and thermal annealing the substrate in the chamber to activate the dopant, thereby changing the zinc oxide thin film exhibiting n-type electrical properties or insulator properties to a zinc oxide thin film exhibiting p-type electrical properties. According to the method, since a zinc oxide thin film exhibiting n-type electrical properties can be easily changed to a zinc oxide thin film exhibiting p-type electrical properties, the provision of holes required for optical devices is facilitated, thereby enabling the development of photoelectric devices such as light-emitting diodes, laser diodes and UV sensors and further extending applicability of the zinc oxide semiconductor.

8 Claims, 4 Drawing Sheets

METHOD FOR MANUFACTURING ZINC OXIDE SEMICONDUCTORS

BACKGROUND OF THE INVENTION

1. Field of the Invention

The present invention relates to a dry etching method of zinc oxide, and more particularly to a method for manufacturing a zinc oxide semiconductor having improved electrical properties.

2. Description of the Related Art

In general, properties of zinc oxide semiconductors are very similar to those of nitride (GaN) semiconductors. However, the free exciton binding energy of the zinc oxide semiconductors is about 60 meV, which is two-fold larger than that of the nitride semiconductors. The zinc oxide semiconductors have an advantage of growing at low temperature. Accordingly, studies on the zinc oxide semiconductors are actively in progress. As examples of methods for manufacturing zinc oxide thin films, RF and DC magnetron sputtering, laser molecular beam epitaxy, chemical vapor deposition (CVD), pulse laser deposition, etc., can be used. Among these methods, the RF and DC magnetron sputtering enables zinc oxide thin films to grow over broad area at a relatively low temperature, compared to other methods. Accordingly, special attention has been paid to the RF and DC magnetron sputtering.

The zinc oxide semiconductors are currently applied in various optoelectronic devices such as transparent electrodes, sound acoustic wave devices, varistors devices and the like. In order to manufacture these optoelectronic devices using zinc oxide, n-type and p-type zinc oxide thin films of high quality and high concentration are required. Studies on the manufacture of n-type zinc oxide semiconductors have made considerable progress, but p-type zinc oxide semiconductors required for the manufacture of optoelectronic devices have not been successfully manufactured. The optoelectronic devices emit energy corresponding to the respective level differences within the energy band by binding of electrons and holes, in the form of light. Accordingly, without high quality p-type zinc oxide semiconductors, good optoelectronic devices cannot be manufactured.

Conventional methods for manufacturing p-type zinc oxide semiconductors have been reported by many research teams.

For example, Yamamoto et al. suggested that p-type zinc oxide semiconductors can theoretically be manufactured using a codoping method which comprises simultaneously n-type doping using nitrogen (N) as a group IV element and p-type doping using Ga or Al as a group III element [T. Yamamoto et al, Jpn. J. Appl. Phys. Part 2 38, L166 (1999)]. M. Joseph et al. reported a p-type zinc oxide semiconductor having a carrier concentration of $4 \times 10^{19}/cm^3$ manufactured using Ga and N [M. Joseph et al, Jpn. J. Appl. Phys. Part 2 38, L1205 (1999)]. Since it is reported that the codoping method has a problem of low reproducibility, the codoping method is not recognized to be a stable and reliable method for manufacturing p-type zinc oxide semiconductors.

Another method for manufacturing a p-type zinc oxide semiconductor was reported by T. Aoki et al. This method comprises depositing zinc phosphide ($Zn_3P_2$) on a substrate and subsequently heat-treating using a laser [T. Aoki et al, Appl. Phys. Lett. 76, 3257 (2000)]. They also reported that an attempt to prove electrical properties of the p-type zinc oxide semiconductor by Hall measurements was not successful. Accordingly, the method of T. Aoki et al. has disadvantageous in terms of poor electrical properties and inefficient manufacturing processes.

Y. R. Ryu et al. reported a method for manufacturing p-type zinc oxide doped with arsenic (As) [Y. R. Ryu et al, J. Crystal Growth 216, 330 (2000)]. However, the p-type electrical properties seem to be exhibited due to a new interfacial layer formed through an interfacial reaction between a GaAs substrate and a zinc oxide thin film, rather than the manufactured p-type zinc oxide. Accordingly, this method is not yet widely recognized.

Recently, many research teams reported successful manufacture of p-type zinc oxide semiconductors doped with nitrogen (N) recognized as an optimal dopant [For example, D. C. Look et al, Appl. Phys. Lett. 81, 1830 (2002)]. In the method of D. C. Look et al., however, the manufactured p-type zinc oxide semiconductor is changed to an n-type zinc oxide semiconductor with the lapse of time. Accordingly, the method has a disadvantage of poor stability.

As discussed above, p-type zinc oxide semiconductors having excellent reproducibility and reliability are not successfully manufactured.

SUMMARY OF THE INVENTION

Therefore, the present invention has been made in view of the above problems, and it is an object of the present invention to provide a method for manufacturing a zinc oxide semiconductor which can change a zinc oxide thin film exhibiting n-type electrical properties to a zinc oxide thin film exhibiting p-type electrical properties.

In order to accomplish the above object of the present invention, there is provided a method for manufacturing a zinc oxide semiconductor which comprises the steps of:

forming a zinc oxide thin film including a group V element as a dopant on a substrate by using a zinc oxide compound containing a group V element or an oxide thereof;

charging the substrate having the zinc oxide thin film formed thereon into a chamber for thermal annealing; and thermal annealing the substrate in the chamber to activate the dopant, thereby changing the zinc oxide thin film exhibiting n-type electrical properties or insulator properties to a zinc oxide thin film exhibiting p-type electrical properties.

The zinc oxide thin film may be formed by using zinc oxide containing 0.001~20% by weight of phosphorous oxide as a target in accordance with RF magnetron sputtering. Alternatively, the zinc oxide thin film can be formed by subjecting the zinc oxide compound to plasma.

The thermal annealing is carried out by raising the inner temperature of the chamber at a rate of 0.1~100° C. per second, and maintaining the temperature at 500~1,500° C. for 10 seconds~30 minutes. It is preferred that the thermal annealing is carried out under nitrogen or inert gas atmosphere.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, the present invention will be explained in more detail with reference to the accompanying drawings illustrating preferred examples.

Figure 1:
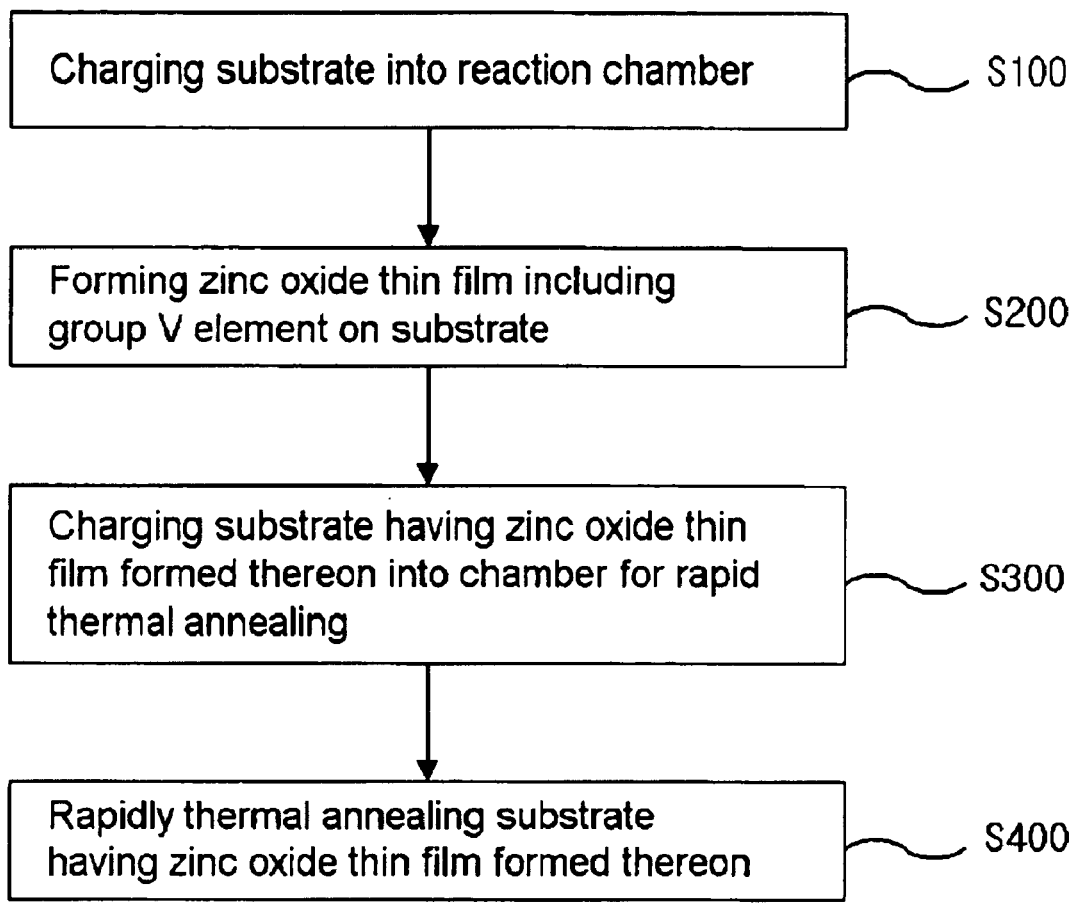
FIG. 1 is a process chart illustrating an Example according to the present invention.

FIG. 1 is a process chart illustrating an Example according to the present invention. Referring to FIG. 1, a substrate is charged into a reaction chamber (S100). As a material of the substrate, silicon, zinc oxide or sapphire is used.

Next, a zinc oxide thin film including a group V element as a dopant is formed on a substrate by using a zinc oxide compound containing a group V element or an oxide thereof (step S200). Examples of the group IV element contained in the zinc oxide compound include nitrogen (N), phosphorus (P), arsenec (AS), antimony (Sb), bismuth (Bi) and the like. The group V element or the oxide thereof contained in the zinc oxide thin film is more advantageous in terms of its lower oxide formation energy than the formation energy of zinc oxide.

Accordingly, almost all substances to be doped exist in the form of an oxide in the zinc oxide thin film.

The zinc oxide thin film is formed by using solid zinc oxide containing 0.001~20% by weight of phosphorous oxide ($P_2O_5$) as a target in accordance with RF magnetron sputtering. Alternatively, the zinc oxide thin film is formed by subjecting the zinc oxide compound containing a group V element or an oxide thereof to plasma, and applying a bias voltage to the substrate. In the case that a source in the form of plasma is used to form the thin film, the reactivity between the group IV element or the oxide thereof and the zinc oxide is improved. The improved reactivity allows more of the group IV element or the oxide thereof to be added to the thin film, thereby further improving doping effect.

Subsequently, in order to activate the dopant, the substrate having the zinc oxide thin film formed thereon is charged into a chamber for rapid thermal annealing (S300) and the substrate is rapidly thermal annealed in the chamber. These steps are carried out to remove oxygen atoms from the oxide compound so as to enable the group V element included in the zinc oxide thin film to function as a p-type dopant. In particular, when the zinc oxide thin film is grown by chemical vapor deposition (CVD), hydrogen atoms, contained in the raw material, can be removed along with oxygen atoms. Accordingly, the rapid thermal annealing is carried out under inert atmosphere such as nitrogen, argon and neon. The substrate is rapidly thermal annealing by raising the inner temperature of the chamber at a rate of 1~100° C. per second, and maintaining the temperature at 500~1,500° C. for 10 seconds ~30 minutes.

Hereinafter, the present invention will be explained in more detail with reference to specific examples and the accompanying drawings showing electrical properties of the zinc oxide thin films. However, these examples are given for the purpose of illustration and are not to be construed as limiting the scope of the invention.

First, zinc oxide thin films doped with phosphorus or phosphorous oxide were formed on a sapphire (0001) substrate at varying temperatures for growing thin films (350° C.~750° C.) in accordance with RF magnetron sputtering. The RF magnetron sputtering uses zinc oxide containing 1.0% by weight of phosphorous oxide ($P_2O_5$) as a target, a material of the thin films.

Electrical properties of the zinc oxide thin films thus formed were measured. The results are listed in Table 1 below.

TABLE 1

| Electrical properties | Growth temperatures | |
| --- | --- | --- |
|  | 550° C. | 750° C. |
| Carrier concentration (/cm³) | 5.11 × 10¹⁶ | 2.95 × 10¹⁵ |
| Mobility (cm²/Vs) | 1.46 | 1.35 |
| Type | n-type | n-type |

As can be seen from Table 1, all the zinc oxide thin films thus formed exhibited n-type electrical properties.

Subsequently, the zinc oxide thin films were charged into a chamber for rapid thermal annealing, and were rapidly thermal annealed by raising the inner temperature of the chamber at a rate of 50~100° C. per second, and maintaining the temperature at 500~1,500° C. for 1~3 minutes.

Figure 2A:
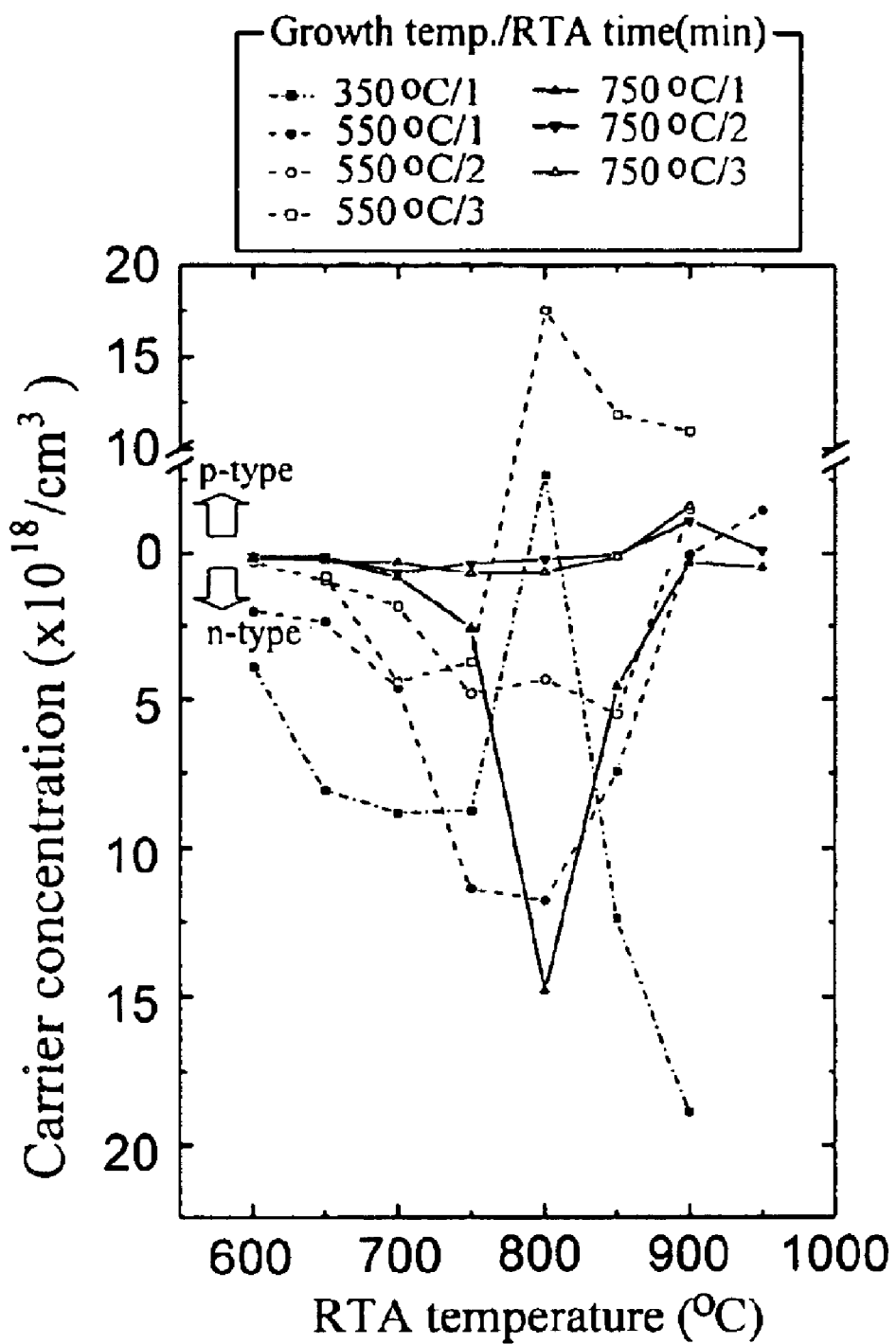
FIGS. 2a and 2b are graphs showing the electrical properties of zinc oxide thin films measured using Hall effect.
Figure 2B:
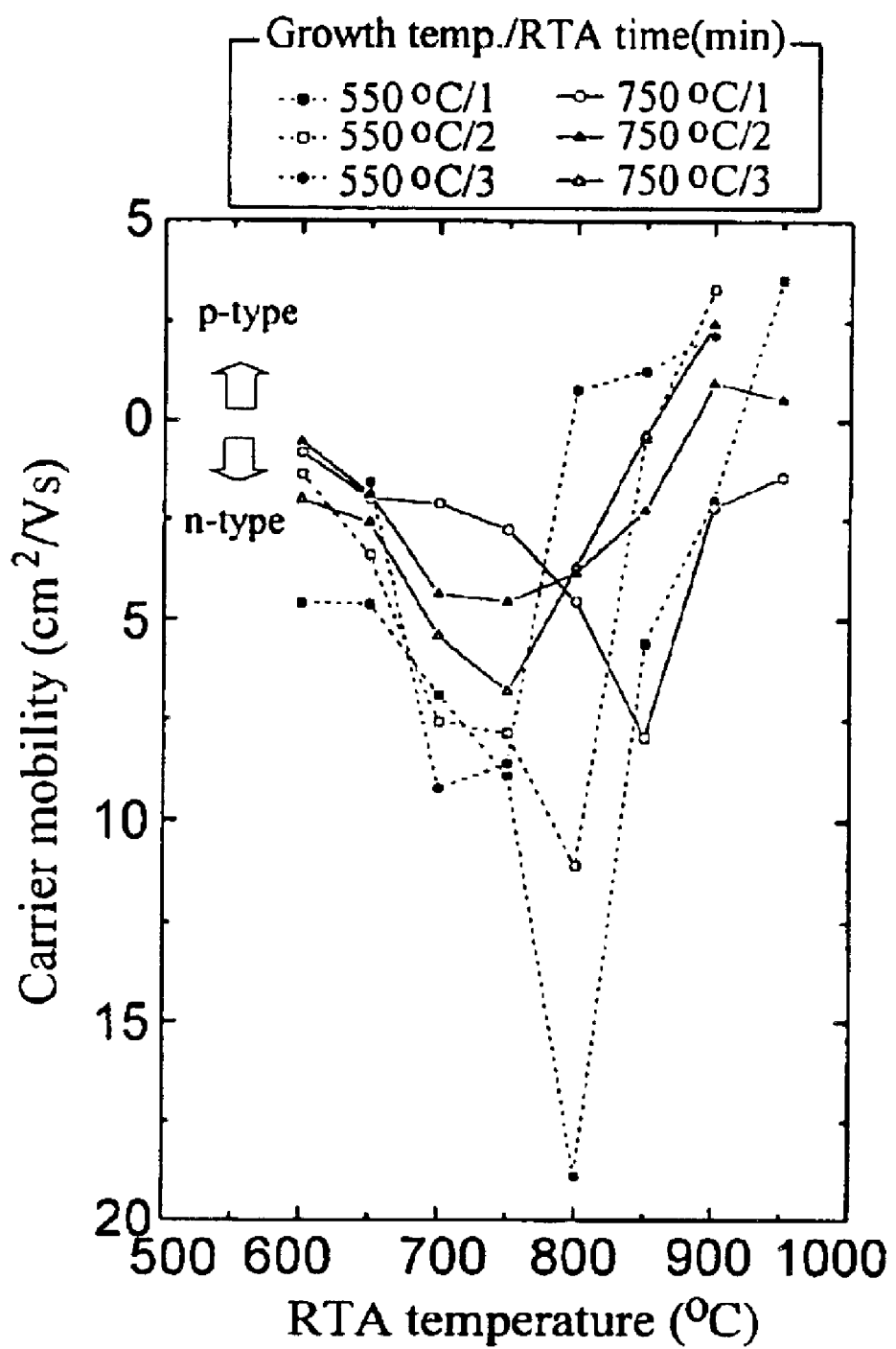
Figure 2C:
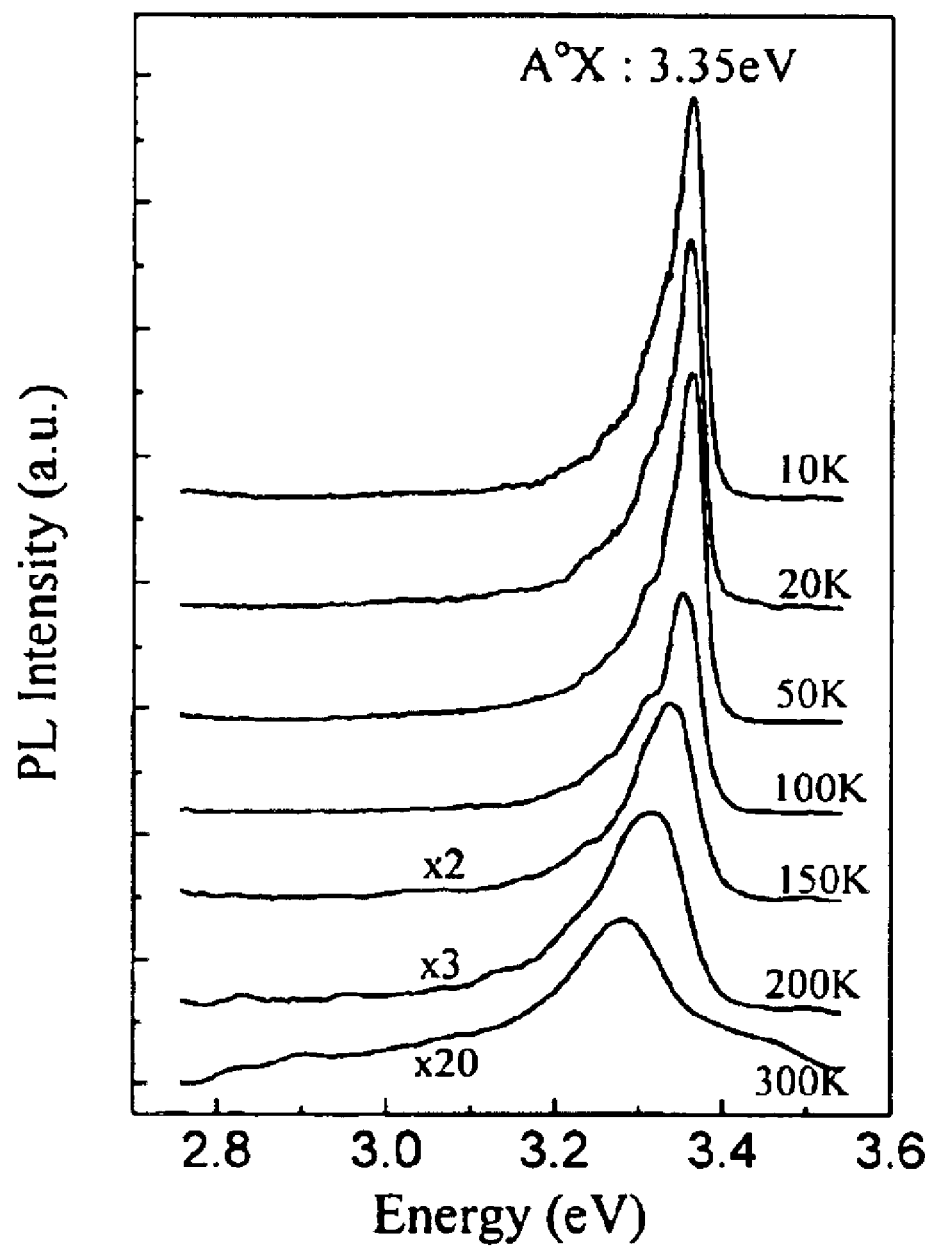
FIG. 2c is a graph showing the optical properties of zinc oxide thin films measured using photoluminescence (PL).

FIGS. 2a and 2b are graphs showing the electrical properties of the zinc oxide thin films measured using Hall effect, and FIG. 2c is a graph showing the optical properties of the zinc oxide thin films measured using photoluminescence (PL).

It can be seen from FIGS. 2a and 2b that the n-type zinc oxide semiconductors having a carrier concentration of about $2.95 \times 10^{15} \sim 8.82 \times 10^{16}$ (/cm³) and a mobility of 0.618~1.46 (cm²/Vs) prior to the rapid thermal annealing were changed to p-type zinc oxide semiconductors having a carrier concentration of $10^{17} \sim 10^{19}$(/cm³) and a mobility of 0.53~3.51(cm²/Vs). In particular, when the temperature for the rapid thermal annealing was 800° C. or more, n-type electrical properties were changed to p-type electrical properties.

Referring to FIG. 2c, an acceptor bound exiton ($A^oX$) peak of 3.35 eV, which is reported to be an optical property of p-type zinc oxide semiconductors, was observed using photoluminescence.

In conclusion, the zinc oxide thin films exhibiting n-type electrical properties were changed to the zinc oxide thin film exhibiting p-type electrical properties by rapid thermal annealing.

As apparent from the above description, the present invention provides a method for manufacturing a zinc oxide semiconductor which can easily change a zinc oxide thin film exhibiting n-type electrical properties to a zinc oxide thin film exhibiting p-type electrical properties.

Therefore, the method for manufacturing a zinc oxide semiconductor according to the present invention facilitates the provision of holes required for optical devices, thereby enabling the development of photoelectric devices such as light-emitting diodes, laser diodes and UV sensors and further extending applicability of the zinc oxide semiconductor.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a zinc oxide semiconductor, comprising the steps of:

forming a zinc oxide thin film including a group V element as a dopant on a substrate by using a zinc oxide compound containing a group V element or an oxide thereof;

charging the substrate having the zinc oxide thin film formed thereon into a chamber for thermal annealing; and thermal annealing the substrate in the chamber to activate the dopant, thereby changing the zinc oxide thin film exhibiting n-type electrical properties or insulator properties to a zinc oxide thin film exhibiting p-type electrical properties.

2. The method for manufacturing a zinc oxide semiconductor according to claim 1, wherein the zinc oxide thin film is formed by using a method selected from sputtering, MOCVD and MBE.

3. The method for manufacturing a zinc oxide semiconductor according to claim 1, wherein the substrate is made of silicon, zinc oxide or sapphire.

4. The method for manufacturing a zinc oxide semiconductor according to claim 1, wherein the dopant is a pure element of group V including phosphorus, arsenic, antimony or bismuth or oxide form thereof.

5. The method for manufacturing a zinc oxide semiconductor according to claim 1, wherein the zinc oxide thin film is formed by using zinc oxide containing 0.001~20% by weight of phosphorous oxide as a target in accordance with RF magnetron sputtering.

6. The method for manufacturing a zinc oxide semiconductor according to claim 1, wherein the zinc oxide thin film is formed by subjecting the zinc oxide compound to plasma.

7. The method for manufacturing a zinc oxide semiconductor according to claim 1, wherein the thermal annealing is carried out by raising the inner temperature of the chamber at a rate of 0.1~100° C. per second, and maintaining the temperature at 500~1,500° C. for 10 seconds~30 minutes.

8. The method for manufacturing a zinc oxide semiconductor according to claim 1, wherein the thermal annealing is carried out under nitrogen or inert gas atmosphere.

* * * * *